(12) United States Patent
Grzesik

(10) Patent No.: US 9,911,774 B2
(45) Date of Patent: Mar. 6, 2018

(54) PHOTODIODE PLACEMENT FOR CROSS TALK SUPPRESSION

(71) Applicant: Massachusetts Institute of Technology, Cambridge, MA (US)

(72) Inventor: Michael J. Grzesik, Lompoc, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 187 days.

(21) Appl. No.: 14/685,992

(22) Filed: Apr. 14, 2015

(65) Prior Publication Data

US 2017/0040368 A1 Feb. 9, 2017

(51) Int. Cl.
*H01L 31/0232* (2014.01)
*H01L 27/146* (2006.01)

(52) U.S. Cl.
CPC .. *H01L 27/14623* (2013.01); *H01L 27/14621* (2013.01); *H01L 27/14627* (2013.01)

(58) Field of Classification Search
CPC ........... H01L 31/1075; H01L 27/14623; H01L 27/14621; H01L 27/14627; H01L 27/1446; H01L 31/0232
See application file for complete search history.

(56) References Cited

U.S. PATENT DOCUMENTS

| | | | |
|---|---|---|---|
| 7,079,307 B2 | 7/2006 | Chun Liu et al. | |
| 7,442,964 B2 | 10/2008 | Wierer, Jr. et al. | |
| 8,415,607 B2 | 4/2013 | Duerksen | |
| 2002/0008767 A1* | 1/2002 | Lee | H01L 27/14603 348/308 |
| 2004/0113085 A1* | 6/2004 | Heismann | G01T 1/2018 250/370.09 |
| 2006/0202107 A1 | 9/2006 | Zarnowski et al. | |
| 2006/0273239 A1* | 12/2006 | McGrath | H01L 31/02327 250/208.1 |
| 2010/0276573 A1* | 11/2010 | Duerksen | H01L 31/1055 250/208.6 |
| 2011/0169117 A1* | 7/2011 | McIntosh | H01L 27/1446 257/432 |
| 2013/0009267 A1 | 1/2013 | Henseler et al. | |

OTHER PUBLICATIONS

PCT/US15/25823, International Search Report, and Written Opinion of the International Searching Authority, PCT/ISA/220, First Sheet-Second Sheet, PCT/ISA/237 cover sheet, Box No. 1 Sheet, Box No. V sheet, Box No. VIII sheet, Supplemental Box sheet, dated Dec. 2015.

(Continued)

*Primary Examiner* — Yosef Gebreyesus
(74) *Attorney, Agent, or Firm* — Theresa A. Lober

(57) ABSTRACT

There is provided a photodiode array. The photodiode array includes a substrate that has an optical interface surface arranged for accepting external input radiation into the substrate. A plurality of photodiodes are disposed at a substrate surface opposite the optical interface surface of the substrate. Each photodiode in the plurality of photodiodes includes a photodiode material that generates light into the substrate as a result of external input radiation absorption by the photodiode. There is aperiodic photodiode placement along at least one direction of the array.

18 Claims, 9 Drawing Sheets

(56) References Cited

OTHER PUBLICATIONS

Ben-Ezra et al., "Penrose Pixels for Super-Resolution," IEEE Transactions on Pattern Analysis and Machine Intelligence, vol. 33, No. 7, pp. 1370-1383, Jul. 2011.

Reulke et al., "Improvement of Spatial Resolution With Staggered Arrays as Used in the Airborne Optical Sensor ADS40," Proceedings of the XXth ISPRS Congress, vol. 35 APRS Part B, pp. 1-6, Istanbul, Turkey, Jul. 2004.

Lange et al., "6000 Element Infrared Focal Plane Array for Reconnaissance Applications," SPIE vol. 3751, Conf. on Airborne Reconnaissance XXIII, Denver, Colorado, pp. 145-158, Jul. 1999.

Harada et al., "A High-Resolution Staggered-Configuration CCD Imager Overlaid with an a-Si:H Photoconductive Layer," IEEE Transactions on Electron Devices, vol. ED32, No. 8, pp. 1499-1504, Aug. 1985.

Jahn et al., "Staggered Line Arrays in Pushbroom Cameras: Theory and Application," International Archives of Photogrammetry and Remote Sensing, vol. XXXIII, Part B1, pp. 164-172, Amsterdam, 2000.

\* cited by examiner

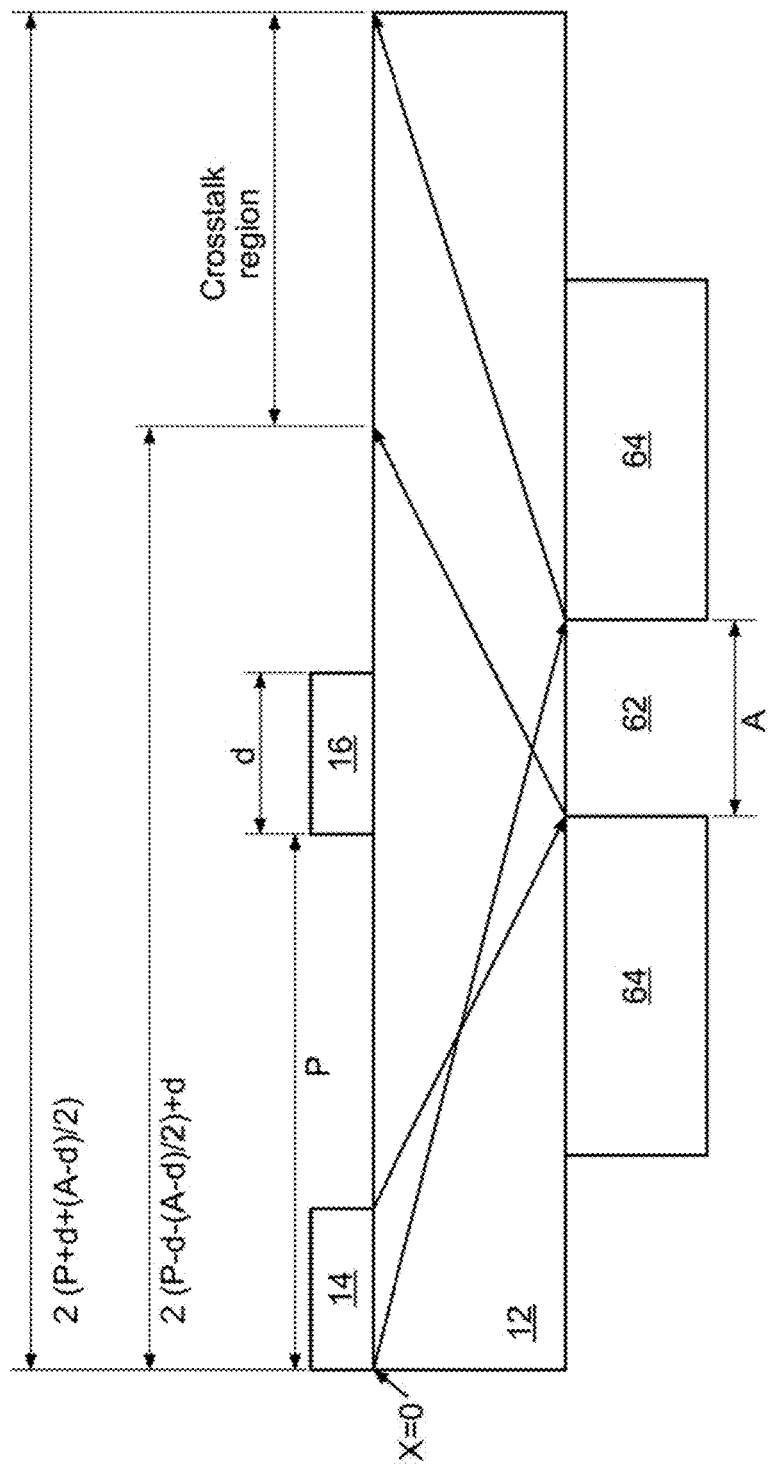

Shift every other row by a half pitch

Shift every other row by a 1/3 pitch

Shift every third row alternately

Shift every third row and third column alternately

PHOTODIODE PLACEMENT FOR CROSS TALK SUPPRESSION

STATEMENT REGARDING FEDERALLY SPONSORED RESEARCH

This invention was made with Government support under Contract No. FA8721-05-C-0002, awarded by the Defense Advanced Research Projects Agency. The Government has certain rights in the invention.

BACKGROUND

This invention relates generally to electronic photodiodes, and more particularly relates to photodiodes that can generate light in the manner of avalanche photodiodes such as Geiger-mode avalanche photodiodes.

Electronic avalanche photodiodes (APDs) operating in Geiger-mode (GM) can be employed to detect single infrared photon arrival with sub-nanosecond accuracy. As a result, Geiger-mode avalanche photodiode arrays are important for a wide range of applications, including photon-counting applications such as astronomy, three-dimensional laser radar (LADAR), and photon-counting based optical communication.

In Geiger-mode operation, an avalanche photodiode is electrically biased above its characteristic breakdown voltage. This is a metastable state because the generation of an electron-hole charge pair in the photodiode, either thermally or through absorption of a photon, can cause the photodiode to break down. For example, upon absorption of a photon at a thusly biased photodiode, breakdown produces a rapid rise in electrical current in the photodiode, which ultimately becomes limited by series resistance and internal space-charge effects. Because an avalanche photodiode when operated in Geiger mode is initially biased a few volts above breakdown, the breakdown event caused by photon absorption produces a large voltage signal swing that is sufficient for directly driving CMOS digital logic.

This is an important attribute of APDs and has enabled the development of Geiger-mode APD arrays bonded directly to readout integrated circuits (ROICs) and micro-optics to form focal plane arrays for use in imaging or other applications. The ability to produce arrays of photodiodes and read them out at high data rates is important for both LADAR and optical-communications applications. The use of an all-digital readout reduces power, and makes the APD technology more easily scalable to large array sizes than competing technologies employing, e.g., linear-mode APDs or photomultiplier tubes.

One limitation of such densely packed Geiger-mode APDs arrays is optical cross talk. When operated in or near Geiger-mode, avalanche photodiodes generate many highly energetic electron/hole charge carrier pairs. Some of these charge carriers lose energy by emitting, within the photodiode substrate material itself, a spectrum of photons, which can be absorbed and detected at other photodiodes in an array of photodiodes disposed in the substrate. Such detection of photons that are secondary, i.e., produced at and coming from a neighboring photodiode in the substrate rather than from a source external to the photodiode array, cause corresponding secondary detection events across the photodiode array. Cross talk is the term used herein to describe this process of secondary photon detection across an APD array. As Geiger-mode APD array size, density, and performance requirements increase, optical cross talk becomes an increasingly limiting source of such secondary photon detection.

SUMMARY

There is provided a photodiode array. The photodiode array includes a substrate that has an optical interface surface arranged for accepting external input radiation into the substrate. A plurality of photodiodes are disposed at a substrate surface opposite the optical interface surface of the substrate. Each photodiode in the plurality of photodiodes includes a photodiode material that generates light into the substrate as a result of external input radiation absorption by the photodiode. There is aperiodic photodiode placement along at least one direction of the array.

This aperiodic photodiode placement results in translational asymmetry along at least one direction of the array. As a consequence, optical cross talk generated by a given photodiode in the array cannot reach or has limited reach to other photodiodes in the array. Cross talk can be substantially reduced by this photodiode placement. Photodiode applications, and particularly those applications requiring precise photon counting, are optimized with this photodiode array configurations.

Other features and advantages will be apparent from the following description and accompanying figures, and from the claims.

BRIEF DESCRIPTION OF THE DRAWINGS

FIG. 7 is a schematic cross section side view of two adjacent photodiodes along a line of photodiodes, defining the geometric factors that set a cross talk region in which cross talk between photodiodes can occur;

DETAILED DESCRIPTION

Figure 1:
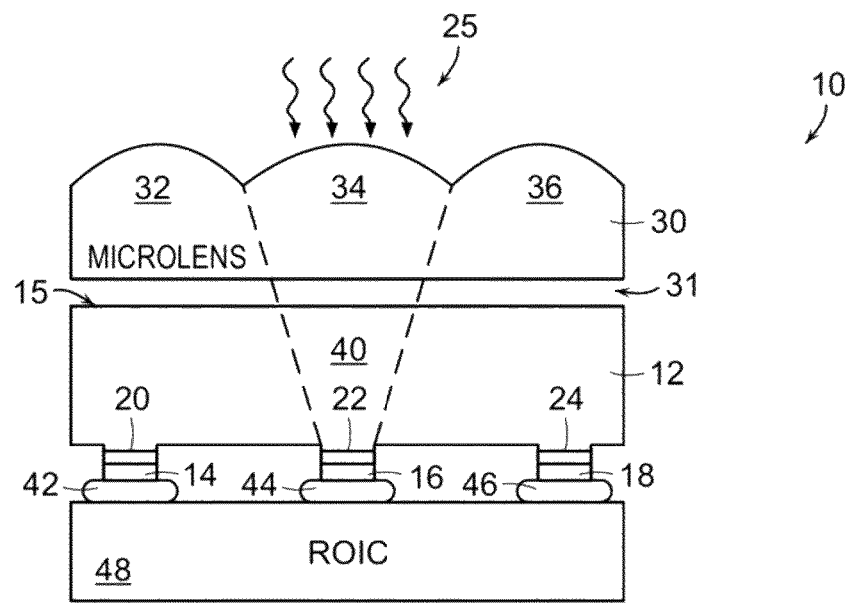
FIG. 1 is a schematic cross-sectional side view of a portion of a photodiode array including configuration of the photodiodes in the array with a microlens array and a read-out integrated circuit.

Referring to FIG. 1, there is schematically shown in cross-sectional side view a region of a photodiode detector 10. The detector 10 can include a microelectronic substrate 12 in which or on which are disposed an array of photodiodes, such as avalanche photodiodes (APDs). Three example photodiodes 14, 16, 18 in an array are shown in FIG. 1. Each photodiode can be formed of any suitable geometry, size, and configuration, e.g., as an inverted mesa structure, and can be configured with suitable functionality, e.g., as an avalanche photodiode, including, e.g., an absorber layer, a grading layer, a field-stop, or charge, layer, and an avalanche, or multiplier, layer, identified together schematically in FIG. 1 as 20, 22, 24, for the photodiodes 14, 16, 18, and described in detail below. An avalanche photodiode structure of this configuration is commonly referred to as a SAM or SAGCM structure.

The photodiode detector array of photodiodes is arranged so that external radiation 25 that is directed toward the array enters the substrate 12 at an optical interface that is substrate surface 15 opposite that at which the photodiodes are disposed. This configuration can be referred to as a backside radiation input configuration. In this configuration, elements such as lenses can be included to aid in radiation collection by the photodiodes in the substrate. For example, a microlens array 30 can be positioned adjacent to the photodiode detector array substrate 12 and optionally, can be separated from the substrate by an air gap 31. Each microlens, e.g., microlens 34 in FIG. 1, can be constructed to focus external light 25, i.e., photons, and direct a cone 40 of focused light to a corresponding photodiode 22. The extent of the gap 31 can accordingly be set to optimize the coupling of light from the lenses to the photodiodes by matching the lens focal length to the thickness of the focal plane array stack. Without a microlens, each photodiode could be sensitive to external light incoming to the array from any angle; the microlens array excludes such background optical input from collection by the photodiode array. In addition, by focusing incoming light, the microlens array enables a reduction in the required photodiode size, thereby increasing the radiation hardness and reducing the dark count rate and optical cross talk of the array. It can therefore be preferred for most applications to configure the photodiode array with an adjacent microlens array, but such is not required.

Photodiodes in the array can be connected directly to circuitry, such as a photodiode read out integrated circuit (ROIC) 48, that is connected to the photodiode array to produce electrical signals indicative of photon arrival time stamps, and/or other information, for each photodiode in the array. Bump bonds 42, 44, 46, or other suitable electrical connection as is known in the art, can be provided to connect the photodiodes of the array to circuitry such as a ROIC 48.

When external radiation 25 is directed to the photodiode array through the optical interface 15, external photons travel through the microelectronic substrate 12 to reach one or more photodiodes. In the case of an array of avalanche photodiodes, an incoming photon causes an avalanche event at a given photodiode if that photodiode has been electrically biased to trigger electrical charge production in response to absorption of an incoming photon. This condition is the "armed" state in which a photodiode is biased for photon absorption and incoming light detection. Such photon absorption triggers the generation of a photon count signal to indicate that a photon has been absorbed by a given photodiode in the array of photodiodes.

Figure 2:
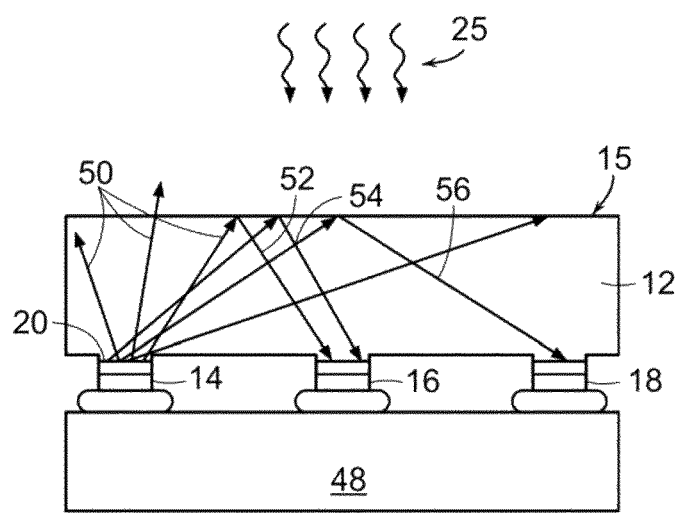
FIG. 2 is a schematic cross-sectional view of the photodiode array portion of FIG. 1, here showing light generated by a photodiode internal to the photodiode array substrate that causes cross talk between the photodiodes.

When a photon is absorbed at a given photodiode, there is produced energetic electrical charge which results in generation of broad spectrum secondary light right in the substrate by that photodiode, due to recombination or relaxation of the electrical charge. FIG. 2 provides a schematic view of this condition. In the example shown in FIG. 2, one photodiode 14 has absorbed a photon and produced secondary light 50 that propagates outward from the photodiode 14 through the substrate 12. The photodiode 14 thereby generates photons internal to the photodiode array; i.e., photodiodes in the array themselves generate photons within the substrate as a result of an avalanche event. Any of this secondary light 50 that is directed through the substrate toward the back surface 15 of the substrate can reflect off of that back surface 15 and propagate back into the substrate 12 at a corresponding reflection angle.

Depending on the geometry of the photodiode array, the size and spacing of each photodiode in the array, and the thickness of the array substrate, rays of secondary light 52, 54, 56 in the substrate that reflect off of the back surface 15 of the substrate 12 can be directed to other photodiodes 16, 18 in the neighborhood of the photodiode 14 at which the secondary light originated. This secondary light in turn can cause avalanche events at the neighboring photodiodes at which the light arrives, if the neighboring photodiodes are armed for photon detection. These secondary avalanche events in turn trigger the neighboring photodiodes to generate spurious photon count signals that are indicative of secondary photon detection rather than primary external photon detection. This triggering of photodiodes by secondary photons that are emitted by a neighboring photodiode into the substrate during a primary avalanche event is referred to as optical coupling or optical cross talk.

Figure 3:
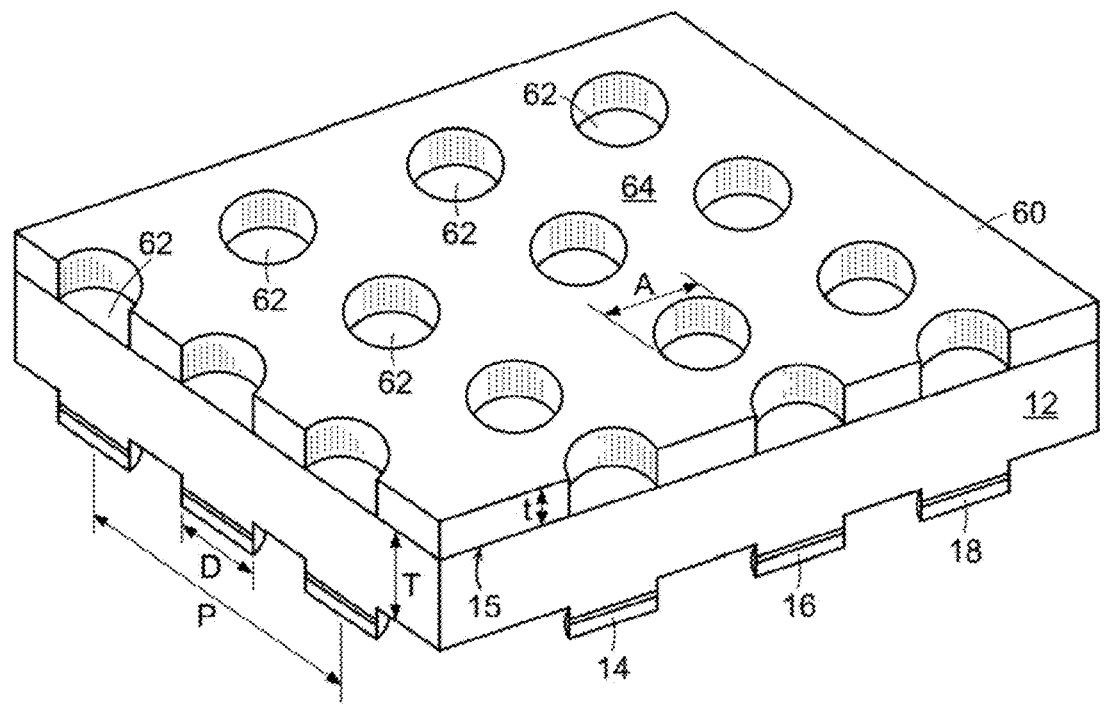
FIG. 3 is a schematic view of a cross talk absorber layer that can be provided on a photodiode array substrate.

Referring to FIG. 3, the optical path between photodiodes in the array can be manipulated to reduce optical coupling between the photodiodes in the array. In one example of this technique, one or more characteristics of the optical interface 15 of the array can be controlled to at least partially suppress internal reflection of secondary photons that are produced and directed to the optical interface 15 as the result of a primary avalanche event at a photodiode in the array substrate. In the example structure of FIG. 3, there can be provided one or more cross talk absorption layers 60 of material disposed on the optical surface 15 of the photodiode array substrate 12, which is the back side of the substrate. The cross talk absorption layer 60 is provided in a pattern that includes open, exposed surface regions or apertures 62 for allowing input radiation to enter the substrate and each photodiode 14, 16, 18. The cross talk absorption layer 60 also includes surface regions 64 which cover the substrate 12 with absorption material, as described in U.S. Patent Application Publication US 2011/0169177, published Jul. 14, 2011, and the entirety of which is hereby incorporated by reference. The microlens array 30 is not shown in this view for clarity; it is to be understood that the microlens array can be positioned atop the cross talk absorption layer 60, either spaced-apart or adjacent to the layers in the manner described below.

The blanket-coating material regions 64 of the cross talk absorption layer 60 at least partially suppress, at the optical interface 15, the internal reflection of secondary radiation that is generated in the substrate due to recombination or relaxation of electrical charge at a photodiode structure during an avalanche event, while the apertures 62 allow transmission of primary external photons into the substrate 12 and to photodiodes in the photodiode array. In one configuration, the one or more cross talk absorption layers 60 are at least partially absorbing media selected to reduce the contribution of secondary interface reflections in the substrate by absorption of the secondary light. Examples of such absorbing media are semiconductors, metals, dielectrics, polymers, molecular or atomic species, quantum wells, photonic crystals, and other suitable media. The cross talk absorption layer 60 can include any number of materials or surface properties provided in any arrangement that results in a desired surface characteristic. For example, anti-reflection coatings and/or similar suitable anti-reflection surface treatments can be provided on regions of the substrate optical interface surface 15 that are outside the optical path of primary photons.

Figure 4:
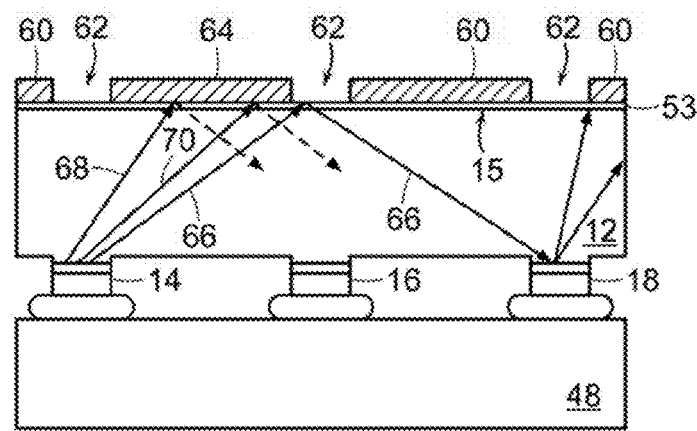
FIG. 4 is a schematic cross-sectional view of the photodiode array of FIG. 2, here including the cross talk absorber layer of FIG. 3.

FIG. 4 illustrates a cross-sectional side view of the photodiode array of FIG. 1 here including an optically absorbing cross talk absorption layer 60 provided on the optical interface surface 15 at which light is incoming to the array. The microlens array is not shown here for clarity. An antireflective coating 53 can be provided on the optical interface surface 15. Given a primary avalanche event at a first photodiode 14, broad spectrum radiation 66, 68, 70 is generated by the avalanche event and is directed within the substrate 12 toward the back surface optical interface 15. One of the secondary light rays 66 is shown reflecting off of the surface 15 at the location of an aperture 62 in the cross talk absorption layer 60. This ray is reflected back into the substrate 12 and is directed to a neighboring photodiode 16, causing a secondary avalanche event at the neighboring photodiode 16. In contrast, light rays 68 and 70 reach the cross talk absorption layer 60 at a location 64 where layer material is disposed. These rays 68, 70 can be at least partially absorbed by the layer material region 64, in which case they do not cause secondary avalanche events at neighboring photodiodes 16, 18. In FIG. 4, the dotted optical rays indicate attenuation of those rays that are at least partially absorbed by the material layer region 64. As demonstrated by the example scenario shown in FIG. 4, the cross talk absorption layer 60 at least partially eliminates cross talk due to photon generation internal to the photodiode array.

Referring back to FIG. 3, the direction of the light rays 66, 68, 70 that are generated from an avalanching photodiode 14 and reflected at the optical interface 15 is set by the geometric parameters of the photodiode detector system. As shown in the figure, the diameter, D, of the photodiodes, the pitch, P, of photodiodes along a line of photodiodes, the thickness, T, of the substrate 12, the thickness, t, of the absorber layer 60, and the diameter, A, of the absorber layer apertures 62 each can contribute to determining the direction of light rays generated from a photodiode.

As shown in FIG. 4, in general, given that the cross talk absorption layer 60 includes apertures that are aligned with photodiodes, the absorber layer reduces cross talk between nearest neighbor photodiodes, that is, diodes that are directly adjacent to each other, in each line of photodiodes, but allows cross talk between other photodiodes, such as second nearest neighbor photodiodes, that is, every other photodiode, in the line of photodiodes. Indeed, in each row, column, or diagonal line of photodiodes in the array, the second nearest neighbor, fourth nearest neighbor, sixth nearest neighbor, and successive even-numbered nearest neighbor photodiodes are all susceptible to cross talk by emission of a photodiode within the photodiode array in the scenario shown here.

To reduce this cross talk between photodiodes in the array, e.g., second and other neighbor photodiodes in the photodiode array, one or more photodiodes in the array, one or more rows of photodiodes, one or more columns of photodiodes, and/or one or more diagonal lines of photodiodes in the photodiode array can be placed at sites in the array that eliminate one or more optical paths of secondary light rays generated internal to the substrate that reflect at the optical interface of the substrate to those photodiode positions. In other words, the photodiodes in the array can be specifically placed at array locations that minimize cross talk of secondary light between the photodiodes in the array. In general, as described in detail below, optical ray tracing analysis can be employed to determine these preferred photodiode locations.

Figure 5A:
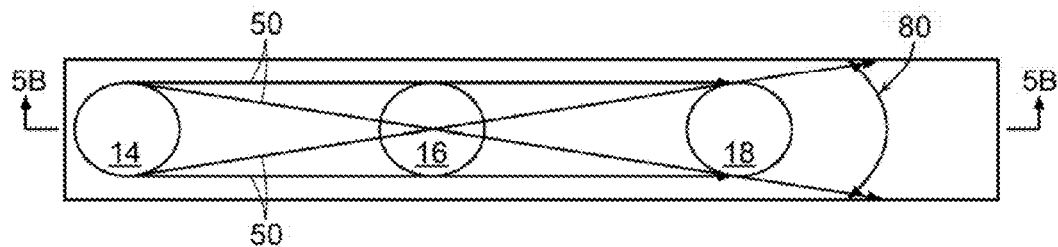
FIGS. 5A-5B are a schematic top-down view of the photodiode array of FIG. 4, and a cross-sectional view of the array, respectively, illustrating ray tracing analysis of cross talk within the photodiode array substrate.
Figure 5B:
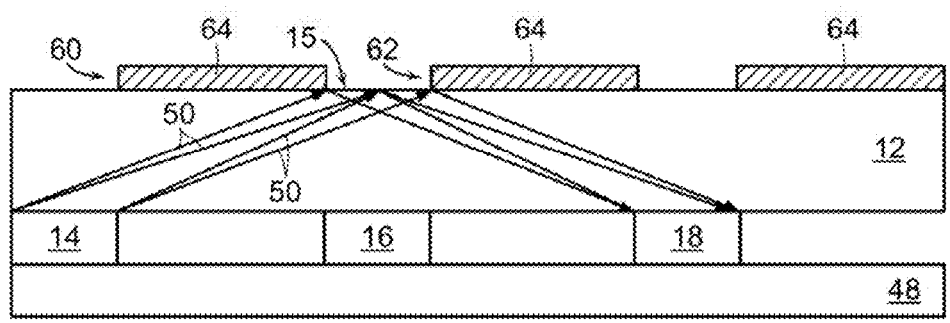

For example, referring to FIG. 5A, there is shown a schematic top-down view of the three example photodiodes 14, 16, 18 of an array FIG. 2, here showing rays 50 of secondary light emission internal to the substrate from one photodiode 14 due to an avalanche event at that photodiode 14. FIG. 5B is a cross-sectional view of the view in FIG. 5A. This example configuration includes a cross talk absorption layer 60 at the optical interface 15, including material regions 64 that absorb secondary light emission and including aperture regions 62 that allow external radiation to reach the photodiodes in the array. The microlens array is not shown here for clarity. As explained above, it is here seen that any secondary cross talk light emission that reaches any site on the optical interface surface 15 that does not include an absorber material region 64 can be reflected to another photodiode in the array, such as the second nearest neighbor photodiode 18 or other neighboring photodiodes, such as successively even-numbered neighbor photodiodes.

Figure 5C:
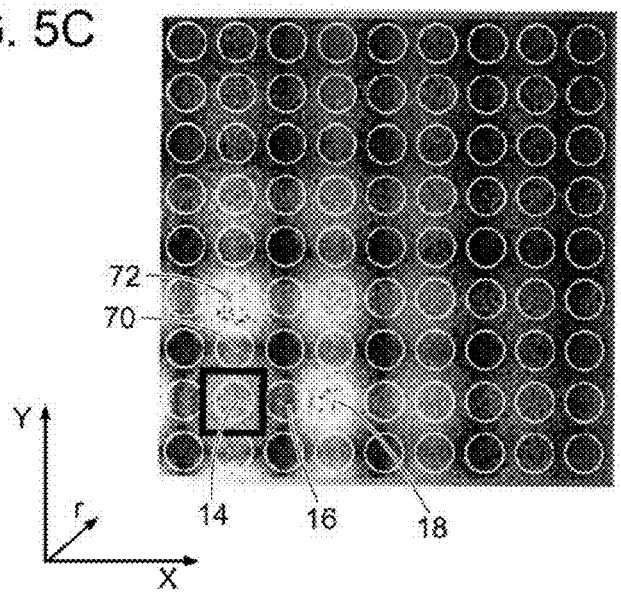
FIG. 5C is an optical mapping of cross talk intensity among photodiodes in the array of FIGS. 5A-5B.

FIG. 5C is a cross talk intensity map representing this condition of cross talk shown in FIGS. 5A-5B. Each photodiode is represented in FIG. 5C by a circle. The photodiode 14 at which an avalanche event occurred is highlighted with a dark square. The second nearest neighbor photodiodes 18, 72 are shown in the figure, by brighter intensity mapping, to have received a maximum of cross talk light from the avalanche event at the originating photodiode 14, due to the pattern of apertures in the absorber layer. The cross talk mapping at the nearest neighbor photodiodes 16, 70 is lower in intensity, indicating that cross talk is reduced or eliminated at nearest neighbor photodiodes by the absorber layer, but that cross talk at second nearest neighbor photodiodes is quite intense. Cross talk at successively higher even-numbered neighbor photodiodes is shown to exist but be less than that of the second nearest neighbor photodiodes.

The cross talk intensity map of FIG. 5C can be determined for any photodiode array configuration and absorber layer aperture geometry, and can include any suitable external elements. While this analysis focuses on reduction of cross talk that exists even with the use of an absorber layer, such an absorber layer can be preferred for many applications; the absorber layer is not in general required. The example photodiode placement control described here is specified for a photodiode array that does include an absorber layer.

The cross talk intensity map of FIG. 5C is instructive in indicating that translational symmetry in a line of photodiodes in any direction of the photodiode array, including the X-axis lateral direction, the Y-axis longitudinal direction, and the r-axis radial direction, allows for internal reflections at the substrate's optical interface that result in cross talk between even-numbered neighbor photodiodes in the array along the direction of symmetry. Stated differently, if the placement of photodiodes in any of the X, Y, or r directions of the photodiode array is periodic, resulting in translational symmetry along a line in that direction, then cross talk will occur for even-numbered neighbor photodiodes along that line of photodiodes due to the periodic photodiode placement. Thus, periodic photodiode placement in rows, periodic photodiode placement in columns, and periodic photodiode placement radially, across a portion or the entire photodiode array, can all produce cross talk between photodiodes along a row, column, or radial line of photodiodes in the array.

Referring back to FIG. 5A, a cone 80 of the highest flux of cross talk photons can be defined for each secondary emission of photons internally through the substrate along lines of photodiodes in each of the X-axis, Y-axis, and r-axis directions of the photodiode array; in the example of FIG. 5A, the cone 80 is defined for the X-direction and shown to encompass the second nearest neighbor photodiode. By prohibiting the placement of photodiodes in a periodic pattern that exhibits translational symmetry in one or more directions, photodiodes are moved out of this cone of cross talk photon flux, and cross talk between even-numbered neighbor photodiodes in the array is at least partially eliminated. FIG. 5C defines the X-axis lateral direction, the Y-axis longitudinal direction, and the r-axis radial direction for a photodiode array for configuring this photodiode placement.

To eliminate translational symmetry along one or more of these directions, the photodiodes can be placed in any selected arrangement that results in aperiodic placement in one or more directions. Aperiodic placement is here defined as photodiode placement in which the unit distance between all photodiodes in a given line of photodiodes cannot be evenly divided by an integer value, k. This condition reduces or completely eliminates translational symmetry along the line of photodiodes. The resulting lack of translational symmetry is evident as a condition in which a pattern of photodiode sites or a subset of photodiode sites cannot be shifted in a given direction to produce the original photodiode site layout.

Figure 6A:
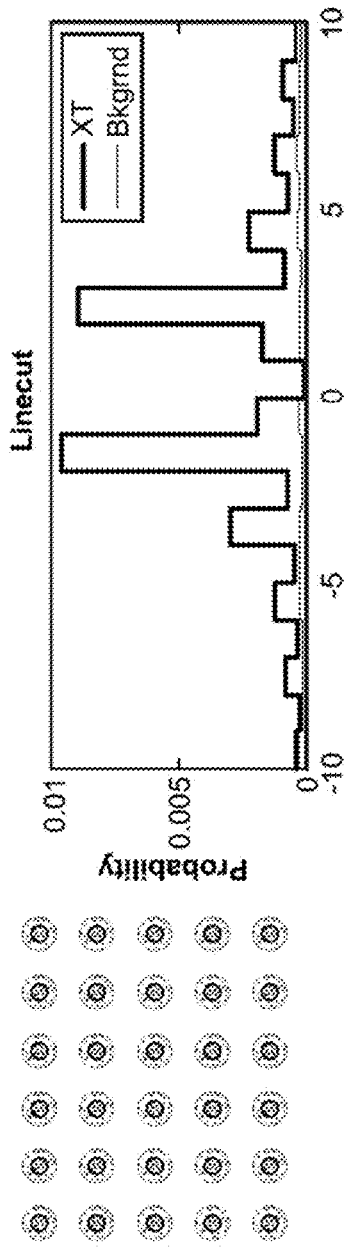
FIG. 6A is a schematic diagram of a periodic symmetric photodiode array, demonstrating translational symmetry.
Figure 6B:
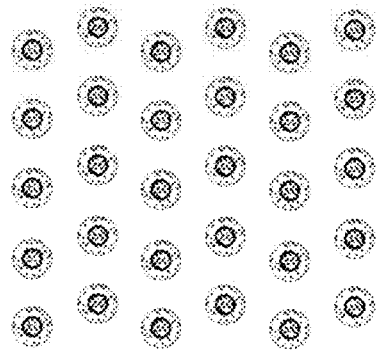
FIG. 6B is a schematic diagram of a photodiode array including rows of photodiodes having a placement that is shifted by ⅓ pitch, demonstrating reduced translational symmetry.

Examples of translational symmetry and lack of translational symmetry are demonstrated in FIGS. 6A-6B. FIG. 6A shows photodiodes in an array of photodiodes. The pitch, P, between photodiodes in the array is the distance between photodiodes shown in FIG. 6A. If a square subset of photodiodes is shifted in the X-direction or the Y-direction by a distance that is the pitch, P, then the shifted photodiodes reside at the sites of other photodiodes. Similarly, if a square subset of photodiodes are shifted diagonally by a distance of $\sqrt{2}P$, then the shifted photodiodes reside at the sites of other photodiodes. Shifting a square subset of photodiodes by any integer multiple of the pitch, P, results in the shifted photodiodes residing on the sites of other photodiodes. This demonstrates a condition of translational symmetry.

In contrast, if as shown in FIG. 6B, the placement of every other row of photodiodes is shifted by one-third the pitch, i.e., ⅓ P, in the Y-direction, then the translational symmetry of the photodiode array is reduced. Although translational symmetry still exists in the Y-direction, translational symmetry is reduced in the X-direction. Shifting a square subset of photodiodes by the photodiode pitch, P, in the Y-direction results in the shifted photodiodes residing at the sites of other photodiodes; but shifting a square subset of photodiodes by the photodiode pitch, P, in the X-direction does not have the same result. The square subset of photodiodes must be shifted in the X-direction by a distance 2P to reside at the sites of other photodiodes. This is a condition of reduced translational symmetry for the photodiode array; by shifting the placement every other photodiode row by one-third the pitch, the translational symmetry has been reduced.

This demonstrates that there can be achieved a condition of reduced translational symmetry or substantially complete lack of translational symmetry, and aperiodicity, for a portion of the photodiode array or the entire photodiode array, along a line of photodiodes in one or more directions. One or more photodiodes can be placed by at sites that are shifted out of a regular periodic photodiode placement in the array, the placement of entire rows of photodiodes can be shifted relative to adjacent or other rows in the array, the placement of entire columns of photodiodes can be shifted relative to adjacent or other columns in the array, the placement of entire diagonal lines of photodiodes can be shifted relative to other diagonal lines, and/or a subset of photodiodes or all of the photodiodes of the array can be individually sited. Columns and rows of photodiodes can be shifted, by the same distance or differing distances, and a shift in rows or columns can be relative to adjacent rows or columns or separated by un-shifted rows or columns. The distance between photodiodes, or pitch, P, can be different for each row and column of photodiodes, can be common for selected rows and columns of photodiodes, and can be enforced selectively at various regions of the photodiode array.

Referring to FIG. 7, the conditions for photodiode placement that reduces or eliminates cross talk can be geometrically defined. Consider two adjacent photodiodes 14, 16, each of a common photodiode diameter, d, with separation there between set by a pitch, P, across a substrate 12. A cross talk absorption layer is provided on the substrate, with absorption regions of material 64 separated by apertures 62 having a common aperture extent, A. By ray tracing rays of light within the substrate 12 that are generated from a first photodiode 14, there is defined a cross talk region in the X-direction, shown in the figure, in which cross talk occurs for any photodiode or portion of photodiode that is placed in that region. The cross talk region is given by any X-direction x value that is more than $2 \cdot (P-d-(A-d)/2)+d$ and that is less than $2 \cdot (P+d+(A-d)/2)$; the origin of the X-direction axis is shown as X=0 in the figure. Any x value between these two values results in cross talk at a photodiode sited at the x value. But if a photodiode is sited at an x value that is $x<2\cdot(P-d-(A-d)/2)+d$ or $x>2\cdot(P+d+(A-d)/2)$, then no cross talk will be directed to the photodiode site.

Any suitable optical analysis or quantitative methodology can be employed to conduct ray tracing for determining the cross talk conditions as shown in the analysis of FIG. 7, for a given placement of photodiodes in an array. For many applications, a commercially-available ray tracing system, such as OpticStudio optical design software, from Zemax, LLC, Redmond, Wash., can be very easily employed to determine the cross talk condition for a given placement of photodiodes.

Figure 8A:
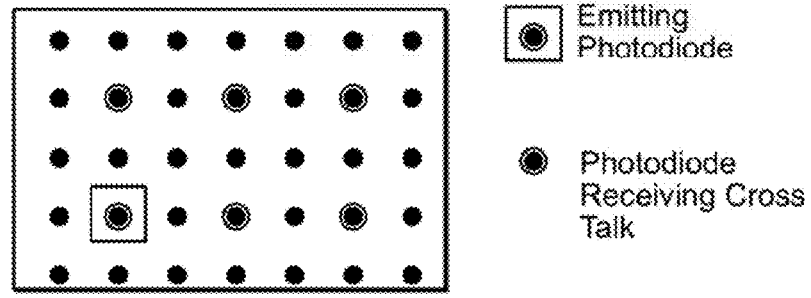
FIG. 8A is a schematic diagram of periodic, symmetric photodiode placement in a photodiode array.

FIGS. 8A-8E illustrate examples of placement of rows and/or columns of photodiodes to at least partially achieve conditions for reduced or eliminated cross talk. FIG. 8A is a schematic representation of an array of photodiodes that are configured in a photodiode detector including an absorber layer on the optical surface of the array substrate in the manner of FIG. 3. Each photodiode in the array is represented by a solid circle. A photodiode in the array that is generating second photons is indicated with a square. The even-numbered neighbor photodiodes from the emitting photodiode are indicated in each of the X-, Y-, and r-axis directions by circles around the photodiodes; these are the photodiodes that receive the most intense cross talk due to emission of secondary photons into the substrate.

Figure 8B:
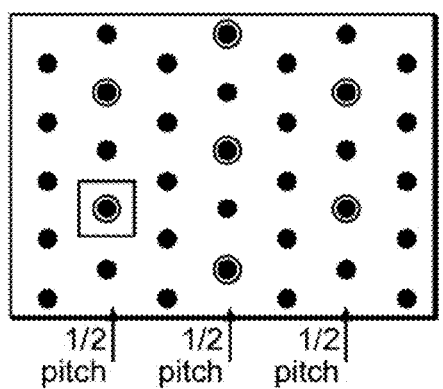
FIGS. 8B-8E are schematic diagrams of example aperiodic, asymmetric photodiode placement for reducing the degree of optical cross talk exhibited by the photodiode placement of FIG. 8A.
Figure 8C:
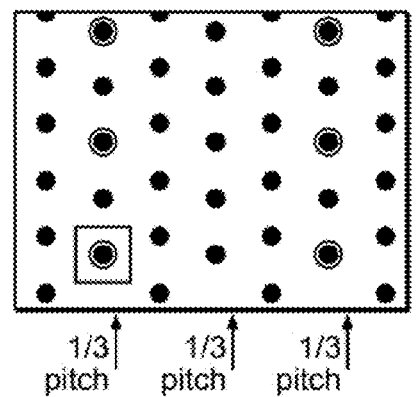
Figure 8D:
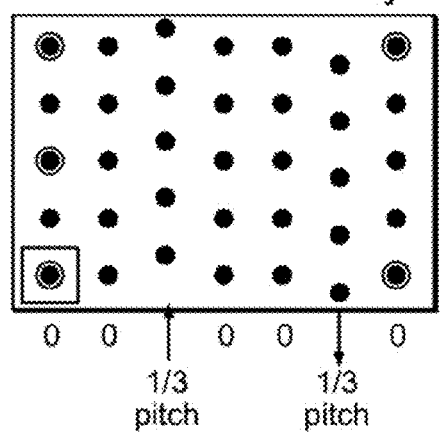
Figure 8E:
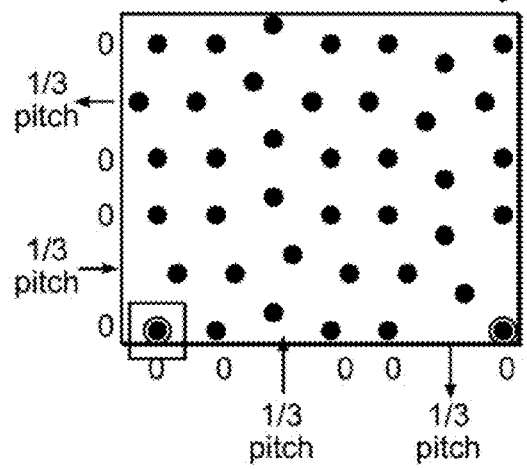

In FIG. 8B there is shown a condition in which the placement of every other row of photodiodes is shifted by ½ the pitch, P, of each row. This reduces cross talk to even-numbered neighbor photodiodes in the X-axis direction by moving photodiodes out of some locations at which cross talk could occur. But the even-numbered neighbor photodiodes in all radial lines from the emitting photodiode are shown to spaced as in the original arrangement, and therefore receive the same secondary photon emission as in the original arrangement. Thus, this configuration reduces translational symmetry but does not eliminate translational symmetry. In FIG. 8C there is shown a condition in which the placement of every other row of photodiodes is shifted by ⅓ the pitch, P, of spacing in each row, as in FIG. 6B. This reduces cross talk by moving photodiodes from locations of cross talk reception in lines along both the X-axis and in the radial direction, i.e., in all diagonal lines of photodiodes from the emitting photodiode. The distance between photodiode neighbors in the Y-axis direction remains the same, and therefore cross talk in the Y-axis direction remains the same, but overall the degree of translational symmetry, and cross talk, is reduced. In FIG. 8D, the placement of every third row of photodiodes is shifted by ⅓ the pitch distance, P, in that row, with each shift alternating in direction of the shift. This results in a large number of photodiodes being moved out of locations of cross talk along lines of photodiodes, and thereby reduces translational symmetry, and cross talk, to an even greater degree. In a further example, shown in FIG. 8E, the placement of every third row of photodiodes is shifted by ⅓ the pitch distance, P, in that row, with each shift alternating between direction of the shift, and every third column of photodiodes is shifted by ⅓ the pitch distance, P, in that column, with each shift alternating between direction of the shift. As shown in FIG. 8E, this placement of photodiodes removes many photodiodes along each line of photodiodes out of locations of cross talk. Only one photodiode of all the photodiodes shown is sited to receive secondary cross talk emission within the substrate under this placement of photodiodes.

With these examples, it is shown that the placement of photodiodes in an array of photodiodes can controlled to reduce cross talk. Photodiode placement in patterns, such as repeating patterns, or tiling arrangements, such as Penrose tiling, can be employed. FIGS. 9A-9D are examples of Penrose tiling arrangements for the placement of photodiodes in an array. Penrose tiling is a geometric construction in which an aperiodic set of a finite number of specified prototiles, i.e., shapes, is employed to generate a non-periodic tiling pattern. The resulting non-periodic pattern of shapes completely lacks any translational symmetry; that is, there is no translational symmetry in any direction of the tiling arrangement.

Figure 9A:
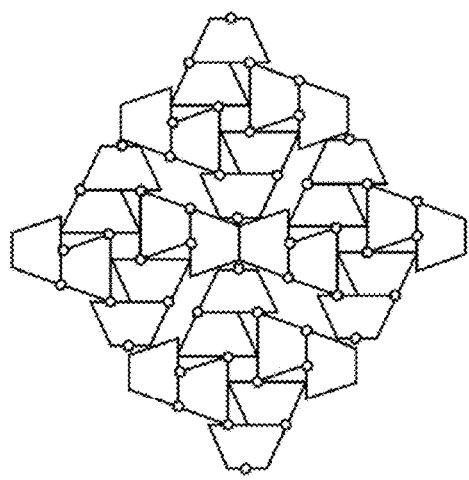
FIGS. 9A-9D are example tiling arrangements for specifying photodiode placement in an aperiodic, asymmetric photodiode array arrangement that exhibits reduced optical cross talk between photodiodes of the array.
Figure 9B:
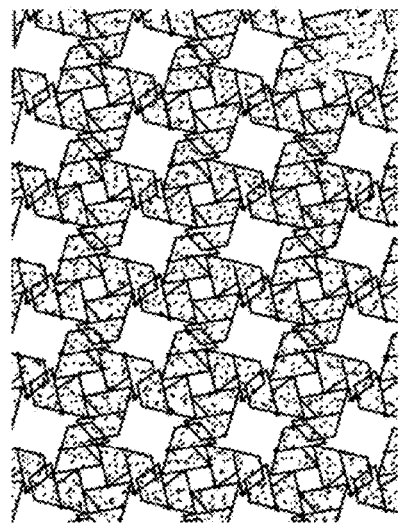

In FIG. 9A, there is shown a pattern of trapezoidal prototiles that can define locations for placement of photodiodes. Photodiode sites are represented as open circles and are positioned at selected points on tile edges. The pattern of trapezoids is non-periodic in all directions. Photodiode placement at selected vertices, centers, or perimeter mid-points of one or more of the prototiles thereby achieves lack of translational symmetry for an array configured with such photodiode placement. So long as the geometric conditions of FIG. 7 are met, such a tiling arrangement can be employed to determine photodiode placement. FIG. 9B is an example of a tiling arrangement having a unit cell that is replicated for determining photodiode placement in an array. In this figure each photodiode is represented by a closed circle. A unit cell of trapezoids with selected photodiode sites is repeated to determine photodiode placement across an entire photodiode array.

Figure 9C:
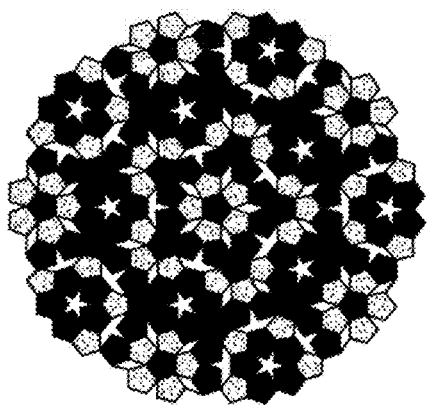
Figure 9D:
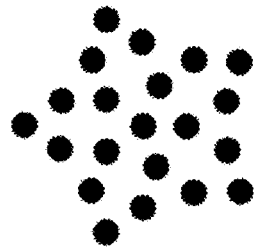

FIG. 9C is a further example of a Penrose tiling arrangement that includes six different prototile shapes. An array of photodiodes can be defined by siting a photodiode at the center of each of one prototile shape, e.g., the star shape, across the tile pattern. For example, placement of a photodiode at each location of a pentagon prototile in the Penrose pattern of FIG. 9C, produces the photodiode array configuration of FIG. 9D. This photodiode array lacks translational symmetry in all of the X-axis, Y-axis, and r-axis directions. Cross talk between even-numbered neighbor photodiodes along any line of photodiodes in the photodiode array is substantially eliminated with this photodiode arrangement. Penrose tiling configurations thereby can provide templates with unit cells on which photodiode placement can be arranged. This scenario can be extended to any fractal-like geometric arrangement. So long as the geometric conditions of FIG. 7 are met so that a photodiode is not placed in the cross talk region, then the arrangement can be employed to reduce or eliminate cross talk.

Figure 10A:
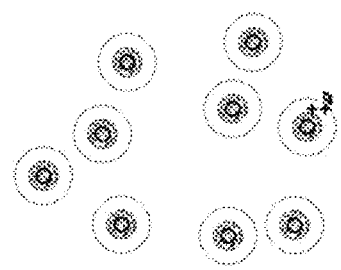
FIGS. 10A-10B are an example aperiodic unit cell of photodiode placement and a example photodiode array configuration built of repeated unit cells, respectively.
Figure 10B:
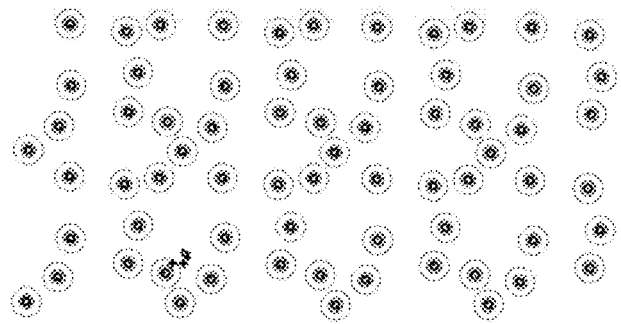

A fully aperiodic photodiode array is not required in all photodiode array configurations; instead, a unit cell of aperiodicity can be employed, as in FIG. 9B, and in some cases, such can eliminate substantially all cross talk in a photodiode array. Here the term unit cell is meant to refer to a configuration of photodiode placement that does not extend across the entire photodiode array. The unit cell can be replicated across a portion of the array, across the entire array, thereby forming the array entirely of unit cells, or can be placed at a site in the array. More than one unit cell can be employed in each arrangement. FIG. 10A is an example unit cell of an aperiodic photodiode placement configuration, and FIG. 10B shows this unit cell repeated in two dimensions to set the placement of photodiodes across a photodiode array.

Thus, a unit cell pattern of photodiode placement can be defined and replicated to designate photodiode locations for an entire photodiode array. The resulting array of photodiodes can exhibit aperiodicity in any one direction, can exhibit aperiodicity in two directions or several directions, or can exhibit aperiodicity all directions, to the point at which a completely aperiodic distribution of photodiodes can be provided across the array. All that is required is the lack of periodicity, i.e., aperiodicity, and in turn, lack of translational symmetry, in at least one direction of lines of photodiodes in the array of photodiodes. This aperiodicity reduces or eliminates cross talk between even-numbered neighbor photodiodes in that line of photodiodes This construction of photodiode placement locations can be achieved with Penrose tiling, unit cell replication, or other tiling arrangement. The self-replicating fractal nature of Penrose tiling or other type of prototiling arrangement thereby allows for ease of construction of photodiode arrays of various sizes and configurations. In addition, the use of aperiodic unit cells of photodiodes allows for elegant photodiode array designs that can be relatively easily accommodated by microlens and ROIC designs, which in general must match the photodiode array layout.

While tiling and unit cell replication provide quite elegant photodiode array designs to reduce cross talk between photodiodes in an array, all that is required, as explained above, is photodiode placement in an array such that one or more photodiodes are placed out of locations at which cross talk could occur due to photon generation in the substrate and due to reflection off of the substrate optical interface surface. Considering an example photodiode placement method, and referring back to FIGS. 3 and 4, the thickness, T, of the photodiode array substrate, the diameter, D, of each photodiode, and the diameter, A, of the cross talk absorption layer 60 to be employed for absorbing nearest neighbor cross talk are first specified. With these parameters fixed, then the placement of photodiodes in the array can be controlled to reduce cross talk in the array substrate. In one design technique, ray tracing analysis is employed to set a parameter that determines placement rules for each photodiode in the array. A commercial ray tracing system, such as that described above, or other ray tracing technique can be employed. The geometric conditions given in FIG. 7 and expressed above can then be imposed to place photodiodes at sites.

Rather than setting individual photodiode placement, unit cell placement, a tiling arrangement, or a selected pattern or patterns of photodiode placement can be considered a priori and then evaluated for cross talk conditions like those of FIG. 7. If translational symmetry exists for the array in any direction, then some degree of cross talk will occur in that direction. The lower the translational symmetry, the less cross talk that will occur in that direction. Photodiode location placement across that photodiode array such that no translational symmetry exists in at least one direction of the array is preferred. Lack of translational symmetry in two directions is more preferred, and lack of translational symmetry in all of the X-direction, Y-direction, and r-direction can be most preferred. So long as any photodiode placement pattern is aperiodic in a given direction, asymmetry in that direction is achieved.

The photodiode array can be implemented with any selected photodiode geometry and selected photodiode elements, and can include additional cross talk reduction features and arrangements. It is preferred that a cross talk absorption layer be provided on the optical interface surface of the array substrate, and can be formed of any suitable absorption material or materials. The apertures in the absorption layer can be circular or any other suitable lateral geometry. For many applications, it can be preferred that the aperture geometry match the lateral geometry of the photodiodes.

Figure 11:
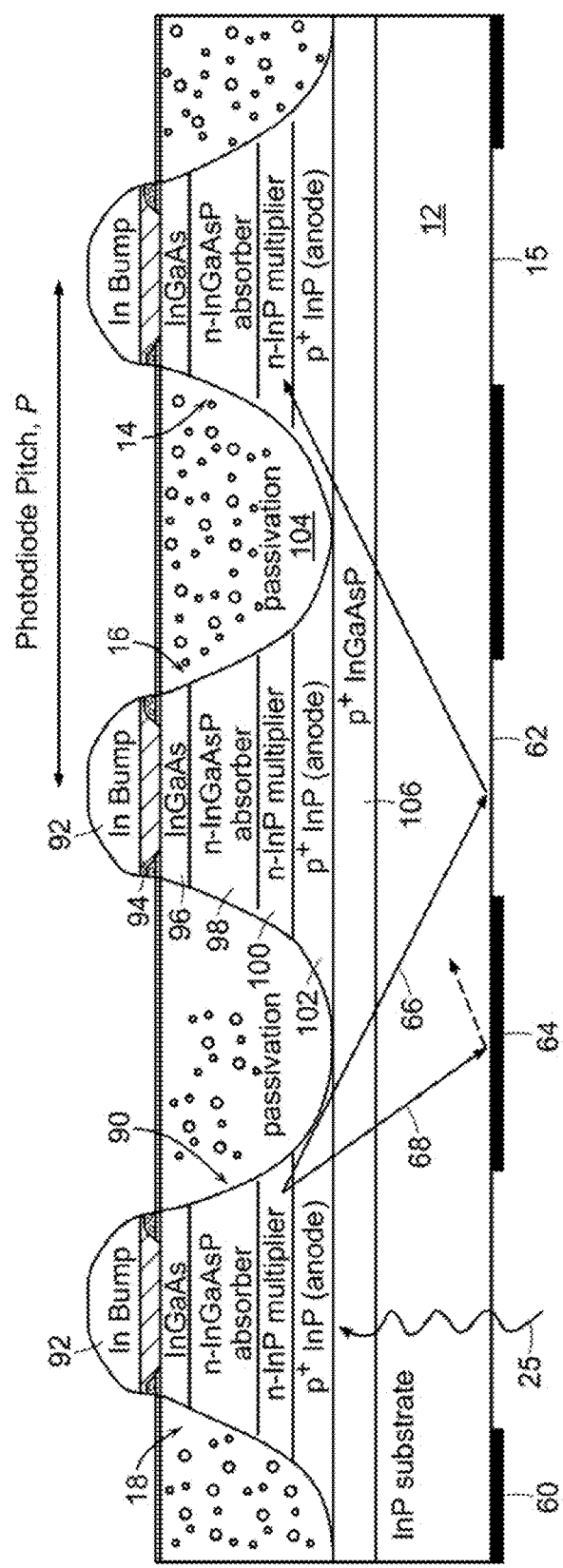
FIG. 11 is a schematic cross-sectional side view of an example photodiode microfabrication implementation.

The photodiodes in the array can be formed of any suitable geometry and configuration for a selected application. Described here is an example of an avalanche photodiode implementation, but such is not in general required. An example avalanche photodiode arrangement is shown schematically in cross-section in FIG. 11m showing three adjacent photodiodes in an array of photodiodes. This figure schematically depicts the three photodiodes shown in cross section in FIGS. 1, 2, and 4, but is turned 180° relative to those figures, i.e., upside down from those figures, for clarity. The photodiodes 14, 16, 18 in FIG. 11 are shown at the top of figure, in the substrate 12, with the optical interface surface 15 at the bottom of the structure. The photodiodes in FIG. 11 are shown as being arranged with a photodiode pitch, P. This pitch is set to meet the aperiodic photodiode placement described above, and can be different in different directions of the array.

The photodiode array substrate 12 is shown in FIG. 11 including a back side cross talk absorption layer 60 having apertures 62 for enabling external light 25 to reach photodiodes in the array, and having material regions 64 for absorbing secondary light emission generated within the array substrate. In this example implementation, each photodiode is provided as a structure of layers, here as an inverted mesa geometry 90 having sidewalls that are preferably sloped to suppress edge breakdown at high-field regions of the mesa. In one example configuration of photodiode layers shown in the example of FIG. 11, there is provided an arrangement of n-type layers on p-type layers, but such is not required; any suitable arrangement of doped layers can be employed. At the top of each mesa there is provided a bump contact 92, made to a top contact 94 of each photodiode, e.g., with indium, for bump bonding to the ROIC circuitry in the manner described above. In the n-type-on-p-type example configuration here, an $n^+$ contact 96, e.g., InGaAs, is provided under the top contact 92.

The photodiode absorber layer 98, as an example here an n-InGaAsP absorber layer, is provided below the contact layer 96 and can be separated by an epitaxial layer, e.g., of $n^+$ InP. The photodiode avalanche layer, or multiplier layer 100, as an example here an $n^-$ InP multiplier layer, is provided below the absorber layer 98, and can be separated by a field stop layer, such as an $n^+$ InP layer. The lower contact 102. i.e., anode, of the photodiode, here as an example a p+ InP layer, is provided below the multiplier layer 100. A passivating material 104, e.g., a layer of polyimide or other suitable material, is provided over each of the photodiode mesas, covering the mesa sidewalls and the lower anode of each photodiode.

There can be incorporated in the photodiode array a cross talk spectral filter layer designed to pass the radiation wavelengths of interest, i.e., to allow external wavelengths of interest to reach the photodiodes through the substrate, while attenuating other regions of the broad hot carrier avalanche emission spectrum of secondary photons that are produced in the array substrate by photodiodes during an avalanche event. In one example, a doped semiconductor layer is provided as the cross talk spectral filter layer, designed with a selected composition that is characterized by a band gap that absorbs the unwanted regions of the radiation spectrum. The photodiode array structure can incorporate both this cross talk spectral filter layer and the cross talk absorption layer described above to increase reduction in optical cross talk in the photodiode array.

As shown in FIG. 11, such a cross talk spectral filter layer 106 that is incorporated into the photodiode array configuration for attenuating secondary radiation in the photodiode array can in one example, shown here, be provided under the lower photodiode contact 102. In this example, the cross talk spectral filter layer 106 is provided as a $p^+$ InGaAsP layer, and extends under all of the mesa photodiodes. In other words, the cross talk spectral filter layer 106 is a continuous blanket layer on the photodiode substrate, with the photodiode mesas disposed on the continuous spectral filter layer. Such is not in general required, however, and can be discontinuous across the array or continuous, as-suitable for a given application and photodiode array geometry.

The bandgap of each of the photodiode absorber and multiplier layers and cross talk spectral filter layer of the photodiode array are specified in concert to achieve efficient and effective Geiger-mode avalanche operation for a selected wavelength or range of wavelengths to be detected as well as to minimize optical cross talk during photodiode avalanche events. In general, each of the layers of the photodiodes in the photodiode array substrate are formed of selected semiconducting materials that provide an appropriate band gap for the function of each layer. The photodiode absorber layer material is characterized by a band gap that corresponds to a wavelength of interest to be detected by the photodetector. Photons absorbed by the photodiode absorber layer generate corresponding electronic charge carriers, and these charge carriers are multiplied by an avalanche event in the multiplier layer for triggering the photodiode detection circuitry. With this operation, semiconductor materials such as Si, Ge, GaAs, InP, GaSb, InGaAs, InGaAsP, CdTe, ZnS, and other such materials are particularly suitable as photodiode layers.

The cut-off wavelength of a photodiode, i.e., the longest wavelength of incoming photons that can be detected by the photodiode, is determined by the bandgap energy of the photodiode layer having the smallest bandgap. At wavelengths longer than this smallest bandgap, external incoming light is not strongly absorbed by the photodiode absorber layer. For example, InGaAs layers can be employed to absorb photons having a wavelength that is less than 1.6 µm, and combined with InP or InAlAs layers to multiply the photo-generated carriers produced in the InGaAs.

During an avalanche event, as photo-generated electronic charge carriers are multiplied, some recombination and relaxation of carriers and generation of photons occurs, as explained above, and such photon generation can result in optical cross talk across the photodiode array. Avalanching photodiodes tend to emit photons over a broad range of wavelengths, both above and below the bandgap of the avalanche multiplier layer material. For example, for photons generated by the multiplier layer that have a wavelength less than the InP bandgap of 910 nm, the photons are reabsorbed in InP layers of the photodiode or in the nearby substrate, and therefore are not transmitted into the photodiode array substrate. For photons generated by the multiplier layer that have a wavelength longer than the InGaAs bandgap, the photons are emitted into the photodiode array substrate, but cannot be strongly absorbed by the absorber layer of other photodiodes. But any photons generated by the multiplier layer having intermediate wavelengths between the bandgap wavelength of the multiplier layer material and the bandgap wavelength of the absorber layer material, in this example between 910 nm and 1600 nm, can be emitted from an avalanching photodiode into the photodiode array substrate and absorbed by a neighboring photodiode in the array, causing the neighboring photodiode to initiate an avalanche event. That is, any photons generated by the avalanche event with a wavelength shorter than about 1600 nm could trigger another correlated avalanche event in the photodiode array due to cross talk in InGaAs/InAlAs or InGaAs/InP APDs.

The cross talk spectral filter layer 106 of the photodiode array, shown in FIG. 11, is designed to filter out of the photodiode substrate such photons generated from an avalanche event that could be reabsorbed into neighboring photodiodes, while allowing photons in the primary detection band, i.e., the pass band of radiation wavelengths to be detected by the photodiode array, to reach the photodiodes in the array. This is particular useful for applications in which a photodiode array is to be employed for detecting a specific wavelength, such as in active laser radar or laser communication receivers.

Thus, there can be implemented in the photodiode array all of a cross talk absorption layer on the optical interface surface of the array, a cross talk spectral filter layer within the photodiode structure on the substrate, and a photodiode placement design that enforces aperiodic photodiode location in at least one direction along lines of photodiodes. With these three design paradigms in place, cross talk in the photodiode array is minimized or substantially eliminated. Any photodiode geometry can be employed, not just the mesa structure described above, and any suitable material platform and set of photodiode materials can be employed.

The photodiode array can include any selected array configuration and elements, such as fuses. Each photodiode can be connected to an individual fuse, or other fusing arrangements can be employed. In addition, other circuit components, such as resistors, inductors, capacitors, or other electrical elements, can be included.

Turning now to considerations for fabrication of the photodiode array, no particular fabrication sequence is required. Any in a wide range of semiconductor materials processing techniques can be employed for producing the photodiode array. In one example process for producing a photodiode array like that of FIG. 11, the photodiode layers are grown by organometallic vapor phase epitaxy (OM-VPE), e.g., on (1 0 0) InP substrates. All of $p^+$, $n^+$, and $n^-$ substrate types can be employed. A cross talk spectral filter layer 106, e.g., of $p^+$ InGaAsP of 1 micron in thickness can be grown first, and then a two-step $p^+$ InP layer 102 growth is carried out to produce the photodiode anode. The lower part of this anode layer is about 1.5 µm thick and includes Zn doping of $1.6 \times 1.018$ cm$^{-3}$, while the upper part is about 0.5 µm-thick and is doped at about $8 \times 10^{17}$ cm$^{-3}$. The nominally undoped InP avalanche multiplier layer 100 is grown next, having a thickness of about 0.8-2.0 µm, with an n-type concentration of about $10^{17}$ cm$^{-3}$. This is followed by a heavily Si-doped $n^+$ InP field stop layer, of $3.5-7 \times 10^{17}$ cm$^{-3}$. The thickness of this layer is selected, based on the layer doping, so that first, the absorber layer is fully depleted at the photodiode over bias and temperature of operation and second, the maximum field in the absorber layer is below a maximum value at the operating conditions. For example, for a photodiode array designed for detection of external radiation of 1.06 µm wavelength, the maximum field in the absorber layer is kept below about $1 \times 10^5$ V/cm, while for a photodiode array designed for detection of external radiation of 1.55 µm wavelength, the maximum field in the absorber layer as small as possible, e.g., about $10^4$ V/cm. The first criterion assures that photo-carriers generated anywhere in the absorber layer are swept quickly to the avalanche layer, thereby reducing jitter. The second criterion minimizes any field-enhanced dark current in the absorber layer.

In this example design, a compositionally-graded InGaAsP layer can be included, if desired, to facilitate the injection of photogenerated holes from the absorber layer into the avalanche layer. This layer is not shown explicitly in the figures as it is of the same materials as the absorber layer, but it is to be understood that such is included in the photodiode structure. The graded layer can be, e.g., about 50 nm in thickness for a 1.06 µm wavelength photodiode and about 100 nm in thickness for a 1.55 µm wavelength photodiode. The nominally undoped InGaAsP or InGaAs absorber layer 98, having a doping level of less than about $10^{15}$ cm$^{-3}$, of thickness about 1.5 µm is then grown. This is followed by growth of an n$^+$ InP layer and a 10 nm-thick n$^+$ electrical contact layer 96, 94. For all layer growth steps, a growth temperature of about 625° C. can be preferred to minimize dark count rate.

With the photodiode layers grown, the photodiode structures can be produced, e.g., by etching of mesa structures 90, if such are desired for a given application. The mesa fabrication process preferably isolates individual photodiodes without introducing defects or current paths that could degrade photodiode performance. In one mesa fabrication process, the grown active layers are etched completely through to the spectral filter layer 106. The mesa etch can be conducted as, e.g., either a nonselective wet etch or an inductively-coupled plasma reactive ion etch followed by a brief wet cleanup etch to remove ion damage. Fabrication of a large-area photodiode array generally requires the use of such a dry etch process because the dry etch process produces a more spatially-uniform etch across a wafer than a deep wet etch. After mesa etching, passivation 104 is applied and a cathode ohmic contact is made to the top of the mesas. With the configuration of FIG. 11, in which external illumination is directed to the optical interface surface 15 of the substrate, then a disk-shaped contact is used, while for top-illuminated devices, an annulus-shaped contact is used. Anode contacts are either made to the back of the photodiode array substrate or on the top to the etched p$^+$ anode layer.

For the back-illumination photodiode array configuration of FIG. 11, the substrate is preferably thinned to about 150 µm and antireflection coatings applied to the back surface. After photolithography and etching to define the antireflection-coated apertures, the backside cross talk absorber layers 60 are evaporated. In one example process, 50 nm of Ge is evaporated, followed by evaporation of 25 nm of Cr, on the entire back surface. A lift-off procedure is then carried out to remove the backside material from the regions above the remaining antireflection-coated apertures, producing the apertures 62 separated by regions of absorbing material 64, with a self-aligned duality of antireflection coating apertures and backside absorption layer material regions across the photodiode array.

Passivation materials such as polyimide, polyimide overcoated with silicon nitride or silicon dioxide, bisbenzocyclotene (BCB), hydrogensilsesquioxanes (HSQ), pyrolytic silicon dioxide, regrown InP, or other suitable material can be employed for passivation of the photodiodes in the array. A polyimide-silicon nitride two-layer coating can be preferred because polyimide coats each mesa and passivates the semiconductor surface and an overcoating of silicon nitride fills in any microcracking and protects the polyimide from low levels of moisture.

A microlens array for mating with the photodiode array can be provided as, e.g., GaP or other suitable material, with a placement of lenses that matches the photodiode placement across the array, and a thickness of, e.g., about 100 µm. The microlens array is preferably coated with antireflection coatings on all surfaces and paired with a photodiode array substrate of appropriate thickness for the focal length of the lens; the substrate can be thinned to match the microlens focal length. Preferably the lens array and photodiode array are precisely aligned, e.g., with active alignment diodes that are provided at, e.g., corners of the photodiode array, that produce photocurrent which can be monitored as the arrays are actively aligned. Bump bonding, e.g., with In bumps, can be completed between the photodiode array and a ROIC prior to microlens array attachment.

Other fabrication processes can be employed to produce any suitable photodiode array configuration and focal plane stack. The photodiode array is not limited to a particular fabrication sequence and is not limited to a particular set of photodiode materials. Any materials that enable production of photodiode operation can be employed.

Experimental Examples

Three photodiode arrays were microfabricated with the avalanche photodiode mesa structure of FIG. 11. The pitch, P, was set at 50 microns, and the diode diameter, D, was set at 12.5 microns. The photodiode multiplier layer and the photodiode absorber were each 1.4 microns-thick, sensitive to 1.03 micron wavelength light, and lattice-matched to InP. A cross talk absorber layer was included having apertures each with a diameter of 30 microns.

The first photodiode array was configured with photodiodes placed in a square array having a uniform pitch, P, across the array. This array configuration is shown in FIG. 6A, where each circle represents a photodiode in one region of the array. The second photodiode array was configured with a shifted placement of photodiode rows by ⅓ of the pitch, P, along the Y-direction. A region of this array configuration is shown in FIG. 6B. The third photodiode array was configured with an aperiodic arrangement of photodiodes specified by the fractal prototile geometry of FIG. 7B. A region of this array configuration is shown in FIG. 14 A.

Each of the three photodiode arrays were operated in Geiger mode, with an overbias of 4 V and a 6 V arming bias, at 500 MHz. The cross talk was determined by measuring the photodiode array response as described by Younger et al., "Cross talk analysis of integrated Geiger-mode avalanche photodiode focal plane arrays," *Proc. SPIE* 7320, Advanced Photon Counting Techniques III, 73200Q, Apr. 29, 2009.

Figure 12:
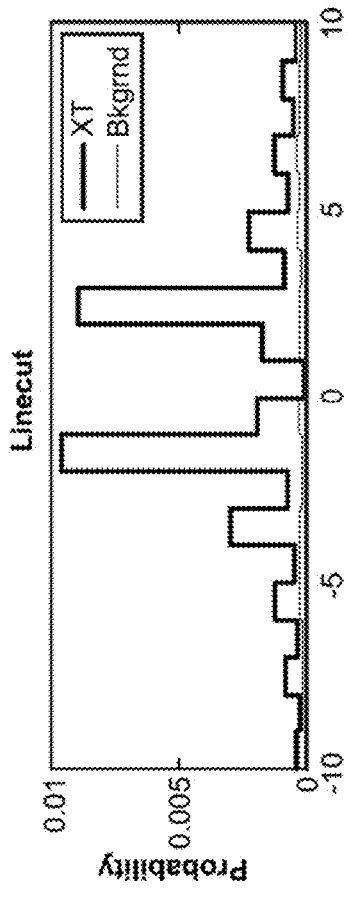
FIG. 12 is a plot of the measured cross talk probability for a microfabricated photodiode array having the placement of FIG. 6A.
Figure 13:
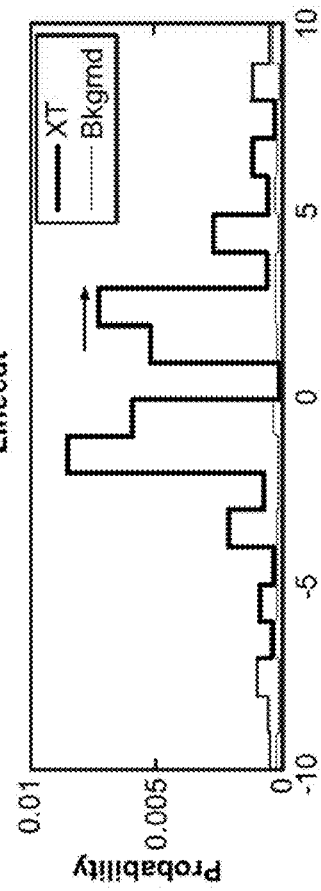
FIG. 13 is a plot of the measured cross talk probability for the microfabricated photodiode array having the placement of FIG. 6B.
Figures 14A, 14B:
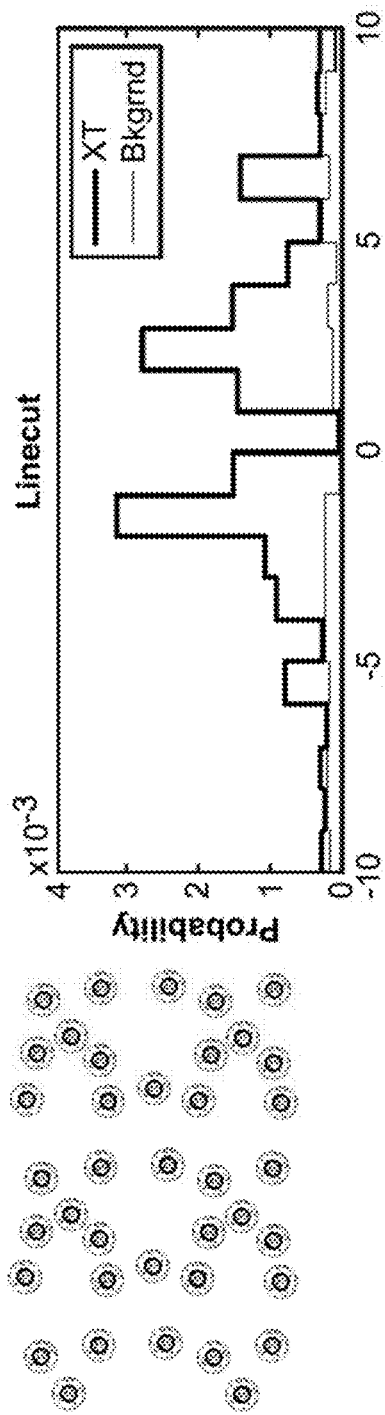
FIGS. 14A-B are a schematic diagram of an aperiodic photodiode placement for an experimental microfabricated photodiode array and the measured cross talk probability for the microfabricated photodiode array, respectively.

The probability of cross talk at each photodiode along a line of ten photodiodes in each of the three arrays was evaluated. FIG. 12 is a plot of the probability of cross talk along a line of twenty photodiodes for the square photodiode array of FIG. 6A. FIG. 13 is a plot of the probability of cross talk along a line of twenty photodiodes for the shifted photodiode array of FIG. 6B. FIG. 14B is a plot of the probability of cross talk along a line of twenty photodiodes for the aperiodic photodiode array of FIG. 14A. In each of these plots, a photodiode that is generating light into the photodiode array substrate is designated as photodiode number one, at the center of the plot, with the ten photodiodes on each side of the emitting photodiode designated as −1 to −10 and 1 to 10. This photodiode numbering is given along the "Linecut" axis of the plots. The probability of cross talk is represented by a line, called XT, and the background cross talk is also plotted separately.

As shown in the plots of FIGS. 12, 13, and 14B, for a uniform square photodiode array, cross talk probability of about 0.01 occurs for second nearest neighbor photodiodes. For an array with shifted photodiode placement, the cross talk probability is reduced for second nearest neighbor photodiodes, as shown in FIG. 14B. For an array with an aperiodic photodiode placement, the cross talk probability is very significantly reduced, to about 0.003. With this arrangement of photodiode placement, cross talk is reduced by an order of magnitude. This experimentally demonstrates that cross talk can be substantially reduced by photodiode placement selection.

With this discussion, there is provided the design of a photodiode array with significantly reduced optical cross talk. As explained above, cross talk in Geiger-mode photodiodes can result in a range of operational limitations, including ghosting/blurring of angle-angle-range images in 3-D laser radar applications, and can induce bit errors in single-photon communication application. Photodiodes that are triggered due to cross talk cannot detect another photon until they are reset. This can cause premature saturation of a photodiode detector, perhaps even blinding a photodiode array before primary photons are detected. Because cross talk is a super-linear process, reduction in the strength of cross talk by a factor of 2-8, as described above, can eliminate such a runaway process that could otherwise blind the majority of photodiodes in an array.

The aperiodic placement of photodiodes along at least one direction in a photodiode array can be implemented without changes to existing microfabrication processes for photodiode array fabrication. A cross talk absorption layer can be applied that directly matches the pattern of photodiode placement. A cross talk spectral filter layer can also be included in the photodiode fabrication by epitaxial growth in the photodiode array fabrication, in concert with optimization of the photodiode absorber layer material, for specific cut-off wavelengths and a selected optical spectrum pass band. The photodiodes can be implemented in silicon, in silicon-based material systems, in III-V material systems, other I-VI systems, or other suitable material systems, and thus these elements are not limited to a particular material system. In any of these materials, the aperiodic photodiode array enables optimal photodiode performance for a wide range of important applications.

It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

I claim:

1. A photodiode array comprising:
    a substrate including an optical interface surface of the substrate that is arranged for accepting an input of external radiation into the substrate;
    a plurality of photodiodes disposed at a substrate surface opposite the optical interface surface of the substrate, each photodiode in said plurality of photodiodes having a photodiode diameter, d, and each said photodiode in said plurality of photodiodes including a photodiode material that generates light into the substrate as a result of absorption of said input of external radiation by each said photodiode;
    a cross talk absorber layer disposed on said optical interface surface, said cross talk absorber layer including a plurality of apertures, each aperture in said plurality of apertures having an aperture extent, A, and said plurality of apertures aligned with said photodiodes in said plurality of photodiodes, said cross talk absorber layer including material regions, between said apertures in said plurality of apertures, that absorb light generated by said photodiodes of said photodiode array; and
    aperiodic placement of at least a portion of said photodiodes is said plurality of photodiodes, said aperiodic placement provided along at least one direction of said photodiode array, said aperiodic placement meeting a condition in which for every two adjacent photodiodes sited along said one direction, with a pitch distance, P, between a first edge of a first one of said two adjacent photodiodes and a first edge of a second one of said two adjacent photodiodes, no photodiode is sited along said one direction at any distance value, x, where $x > 2 \cdot (P - d - (A-d)/2) + d$, and $x < 2 \cdot (P + d + (A-d)/2)$, with said distance value, x, measured from said first edge of said first one of said two adjacent photodiodes.

2. The photodiode array of claim 1 wherein said photodiodes in said plurality of photodiodes are arranged in rows of photodiodes and columns of photodiodes and wherein said aperiodic placement of at least a portion of said photodiodes in said plurality of photodiodes is aperiodic in a plurality of rows of said photodiodes.

3. The photodiode array of claim 1 wherein said photodiodes in said plurality of photodiodes are arranged in rows of photodiodes and columns of photodiodes and wherein said aperiodic placement of at least a portion of said photodiodes in said plurality of photodiodes aperiodic in a plurality of columns of said photodiodes.

4. The photodiode array of claim 1 wherein said aperiodic placement of at least a portion of said photodiodes in said plurality of photodiodes is aperiodic in at least two directions of said photodiode array.

5. The photodiode array of claim 1 wherein said aperiodic placement of at least a portion of said photodiodes in said plurality of photodiodes comprises tiling of a unit cell of photodiode placement across at least a portion of said photodiode array.

6. The photodiode array of claim 1 further comprising a spectral filter layer disposed on said substrate surface opposite said optical interface surface of said substrate and including a material that filters out light generated by said photodiodes in said plurality of photodiodes of said photodiode array.

7. The photodiode array of claim 1 further comprising a connection from each said photodiode in said plurality of photodiodes to read-out circuitry.

8. The photodiode array of claim 1 further comprising an array of lenses disposed at the optical interface surface for focusing said input of external radiation to said plurality of photodiodes.

9. A photodiode array comprising:
    a substrate including an optical interface surface of the substrate that is arranged for accepting an input of external radiation into the substrate;
    a plurality of photodiodes disposed at a substrate surface opposite the optical interface surface of the substrate, each photodiode in said plurality of photodiodes having a photodiode diameter, d, and each said photodiode in the plurality of photodiodes including a photodiode material that generates light into the substrate as a result of absorption of said input of external radiation by each said photodiode;
    a cross talk absorber layer disposed on said optical interface surface, said cross talk absorber layer including a plurality of apertures, each aperture in said plurality of apertures having an aperture extent, A, and said plurality of apertures aligned with said photodiodes in said plurality of photodiodes, said cross talk absorber layer including material regions, between said apertures in said plurality of apertures, that absorb light generated by said photodiodes of said photodiode array; and
    an aperiodic pattern of said photodiodes in the plurality of photodiodes, said aperiodic pattern extending across said photodiode array, said aperiodic pattern meeting as condition in which for every two adjacent photodiodes sited along a direction in said aperiodic pattern, with a pitch distance, P, between a first edge of a first one of said two adjacent photodiodes and a first edge of a second one of said two adjacent photodiodes, no photodiode is sited along said direction at any distance value, x, where $x>2\cdot(P-d-(A-d)/2)+d$, and $x<2\cdot(P+d+(A-d)/2)$, with said distance value, x, measured from said first edge of said first one of said two adjacent photodiodes.

10. The hot diode array of claim 9 wherein the aperiodic pattern of photodiodes is based on a Penrose tiling pattern.

11. A photodiode array comprising:
a substrate including an optical interface surface of the substrate that is arranged for accepting an input of external radiation into the substrate;
a plurality of photodiodes disposed at a substrate surface opposite the optical interface surface of the substrate, each photodiode in said plurality of photodiodes having a photodiode diameter, d, and each said photodiode in said plurality of photodiodes including a photodiode material that generates light into the substrate as a result of absorption of said input of external radiation by each said photodiode;
a cross talk absorber layer disposed on said optical interface surface, said cross talk absorber layer including a plurality of apertures, each aperture in said plurality of apertures baying an aperture extent, A, and said plurality of apertures aligned with said photodiodes in said plurality of photodiodes, said cross talk absorber layer including material regions, between said apertures in said plurality of apertures, that absorb light generated by said photodiodes of said photodiode array; and
translational asymmetry in placement of at least a portion of said photodiodes in said plurality of photodiodes in at least one direction of said photodiode array, said translational asymmetry in placement meeting a condition in which for every two adjacent photodiodes sited along said one direction, with a pitch distance, P, between a first edge of a first one of said two adjacent photodiodes and a first edge of a second one of said two adjacent photodiodes, no photodiode is sited along said one direction at any distance value, x, where $x>2\cdot(P-d-(A-d)/2)+d$, and $x<2\cdot(P+d+(A-d)/2)$, with said distance value, x, measured from said first edge of said first one of said two adjacent photodiodes.

12. The photodiode array of claim 11 wherein said translational asymmetry in placement of said photodiodes in said plurality of photodiodes is in at least two directions of said photodiode array.

13. The photodiode array of claim 11 wherein the substrate comprises a material.

14. The photodiode array of claim 11 wherein each said photodiode in said plurality of photodiodes comprises a mesa photodiode.

15. The photodiode array of claim 11 wherein each said photodiode in said plurality of photodiodes comprises a III-IV multiplier material.

16. The photodiode array of claim 11 wherein said placement of said photodiodes in said plurality of photodiodes has translational asymmetry across a portion of said photodiode array.

17. The photodiode array of claim 11 wherein said placement of said photodiodes in said plurality of photodiodes has translational asymmetry in X and Y directions.

18. The photodiode array of claim 11 further comprising a spectral filter layer disposed on said substrate opposite said optical interface surface of said substrate and including a material that filters out light generated by said photodiodes in said plurality of photodiodes of said photodiode array.

* * * * *